United States Patent [19]

Sund

[11] Patent Number: 5,335,843

[45] Date of Patent: Aug. 9, 1994

[54] SOLDERING PROCESS AND APPARATUS

[76] Inventor: William Sund, 8 Amos Crescent, Downsview, Ontario, Canada, M3H 3X9

[21] Appl. No.: 135,592

[22] Filed: Oct. 13, 1993

[51] Int. Cl.$^5$ ............................. B23K 1/00; B23K 3/00
[52] U.S. Cl. ................................. 228/180.1; 228/259; 228/40; 228/56.1
[58] Field of Search ............... 228/180.1, 259, 260, 228/37, 40, 56.1

[56] References Cited

U.S. PATENT DOCUMENTS

| | | | |
|---|---|---|---|
| 4,083,323 | 4/1978 | Rote | 228/20.1 |
| 4,506,820 | 3/1985 | Brucker | 228/56.1 |
| 4,518,114 | 5/1985 | Walsh | 228/37 |
| 4,632,291 | 12/1986 | Rahn et al. | 228/9 |
| 4,776,508 | 10/1988 | Tanny | 228/259 |

Primary Examiner—Samuel M. Heinrich
Attorney, Agent, or Firm—McConnell and Fox

[57] ABSTRACT

A soldering process and apparatus for soldering difficult to reach junctions. Small containers, just large enough to accommodate the junctions are filled to overflowing from a pot of liquid solder. Once filled the flow of solder is terminated and the junction dipped into the container. The meniscus on the liquid solder in the container establishes a consistent level enabling a mechanized process to dip the junctions the same depth each time. Between dips the container is refilled. The size of the container limits the exposure of other adjacent devices to the heat of the solder and also provides a limited quantity of solder to the junction thus providing a consistent soldered connection.

12 Claims, 3 Drawing Sheets

SOLDERING PROCESS AND APPARATUS

FIELD OF THE INVENTION

This invention relates to metal to metal joining processes and in particular to spot soldering of single lead points and soldering processes for soldering of components in the locality of other components which must not be exposed to the same process.

PRIOR ART

It has been well known for many years to solder circuit boards by what is termed "wave soldering" processes. In these processes the circuit board, with a number of components arranged with their leads projecting down through the board, is passed over a pool or bath of solder which coats the leads and the conductors on the surface of the board bonding them together. The components on the upper side of the board are protected from direct contact with the molten solder by the board. If now it is necessary to mount further components on the board it may be necessary to spot solder them by hand because they are near heat sensitive components or because they must be soldered on the same side of the board as other components already mounted. This can be a very time consuming process and because of space limitations it may not be possible to automate the soldering process.

In the past the completion of single lead points such as the connection of motors, fuses, coils or other electrical components to their leads has usually been a manual process requiring some skill and judgment. The necessary control of temperature, solder quantity and placement has made automation difficult.

SUMMARY OF THE INVENTION

In accordance with this invention the solder is applied to a specific location in controlled quantity and controlled temperature.

In the case of an assembled circuit board which is to have additional components installed and spot soldered in place by localized solder application the apparatus is arranged as follows. Cups are arranged to surround only the leads which it is desired to solder. The walls of the cups may be made very thin to pass between the leads being soldered and any adjacent structure. The height of the cups is made sufficient to enter any recess as necessary to reach the terminals being soldered. The cups are filled with solder to overflowing and then the cups and leads or terminals moved towards each other until the leads and the board conductors are just immersed in the solder. Because the cups are filled to overflowing the location of the surface of the solder is determined by the height of the meniscus and the relative motion of the cups and the terminals necessary to immerse the desired joint in solder can be established. The solder is kept away from other components and thus they are not exposed to the heat.

In the case of single lead points which require spot soldering a single pin is provided with an aperture at its top. The aperture is filled to overflowing with solder and then the pin and the lead point are moved towards each other until the junction is immersed. The aperture determines the volume of solder and the meniscus formed when filled to overflowing accurately determines the location of the solder surface.

A similar arrangement may be used for pre-coating the terminals with flux or a low flux process utilizing inert atmosphere, as described in U.S. Pat. No. 4,821,947, may be used.

A clearer understanding of my invention may be had from a consideration of the following description and drawings in which:

DESCRIPTION OF THE PREFERRED EMBODIMENTS

Figure 1:
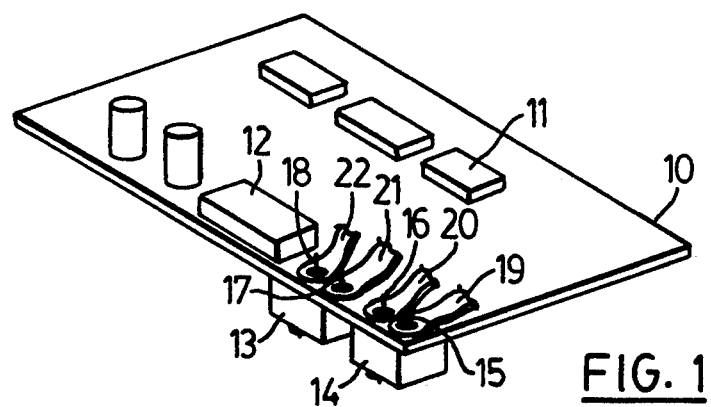
FIG. 1 is an perspective view of a typical printed board with components on both faces.

Considering first FIG. 1 there is shown a standard printed circuit board 10 with components such as items 11 and 12 mounted on its upper surface and soldered in place to conductors on the lower surface by a wave soldering process. Additional components 13 and 14 are mounted on the lower surface for functional reasons and their terminals 15, 16, 17, and 18, must be connected to conductors such as conductors 19, 20, 21, and 22 on the upper surface. As will be seen, terminal 18 is very close to component 12 and any attempt to solder this terminal to conductor 21 by hand will risk exposing component 12 to excess heat.

Figure 2:
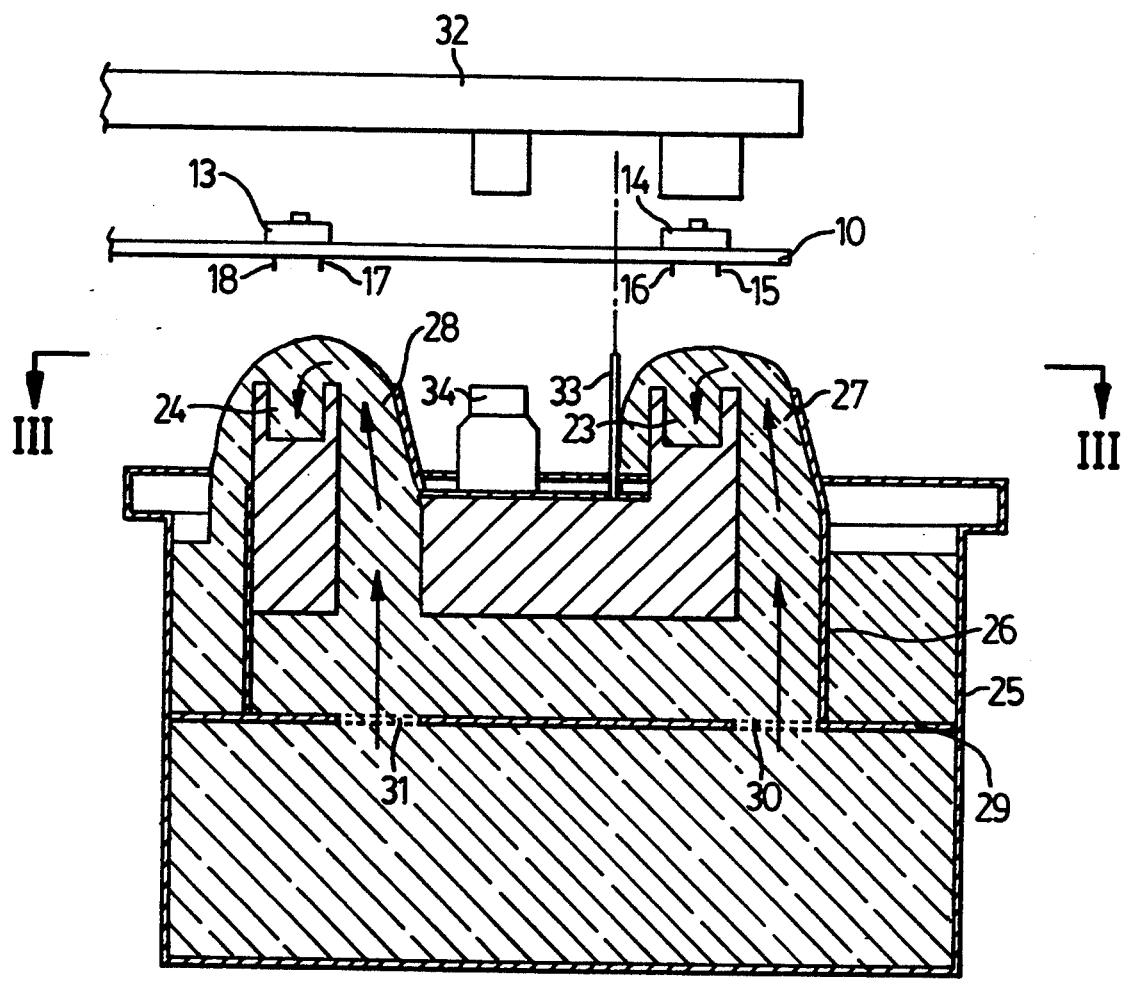
FIG. 2 is an elevational view, in section, of a portion of a soldering apparatus in accordance with my invention.
Figure 3:
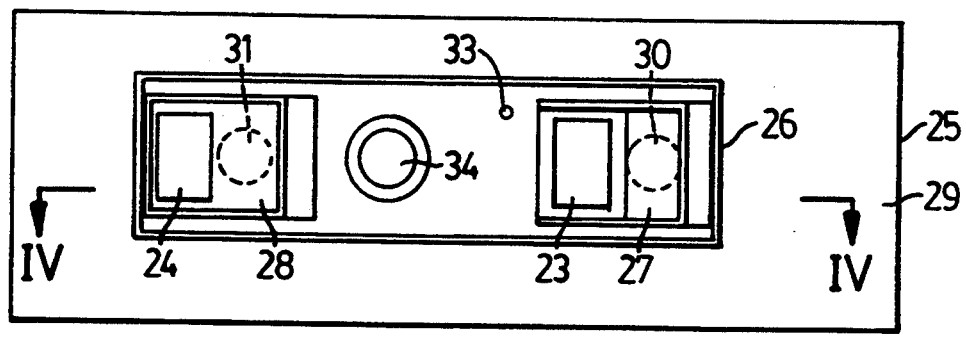
FIG. 3 is a plan view of a portion of the apparatus of FIG. 2 at section line III—III.

FIGS. 2 and 3 illustrate a portion of the apparatus at a stage in the process before the soldering process takes place. The cups 23 and 24, supported in the fixture 26 are supplied with solder from the solder pot 25 through ducts 27 and 28. Fixture 26 is held down on wall 29 which extends across the solder pot 25 and is provided with orifices 30 and 31 registering with the lower ends of ducts 27 and 28. A pump 39, shown in FIG. 5, causes the solder in the pot to be under pressure below wall 29 and thus flow up through orifices 30 and 31 and up ducts 27 and 28 flooding cups 23 and 24 and overflowing as shown.

The board 10, mounted on a suitable bracket 32, is held above the fixture 26 and arranged to be lowered on to it, aligned by registration pins such as pin 33 and supported by board support pillars such as pillar 34. Before the board is lowered the pump 39 is shut off and the solder level in cups 23 and 24 determined by the meniscus formed by the solder. When the board is lowered it is exposed in close proximity to the molten solder only in the area defined by the cups and surrounding the terminals 15–18.

Figure 4:
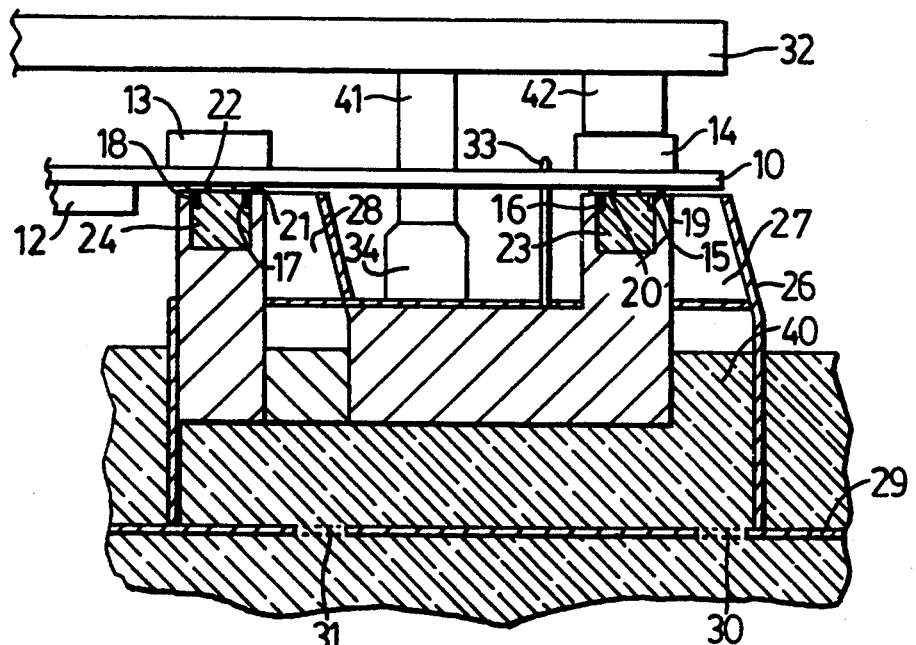
FIG. 4 is an elevational view of a portion of the soldering apparatus at section line IV—IV in FIG. 3 during the soldering operation.

Considering now FIG. 4, which illustrates a section of a portion of the board of FIG. 1 during the soldering process, it will be seen that the board 10 and fixture 26 have been moved towards each other and the terminals 15–18 and conductors 19–22 are immersed in solder contained in the cups 23 and 24. The general level of the surface 40 of the solder in the solder pot 25 is well below the component 12 while the solder in cups 23 and 24 wets both the terminals 15–18 and the conductors 19–22.

As is seen, the fixture 26 is designed specifically for the particular situation. The cups 23 and 24 are spaced to align with components 13 and 14 and their terminals and alignment of the board 10 with the fixture assured by the alignment pin 33. Similarly, the bracket 32 is designed specifically for the board being soldered with board supports 41 and component holding device 42 arranged to retain the elements in their proper position during the process.

Figure 5:
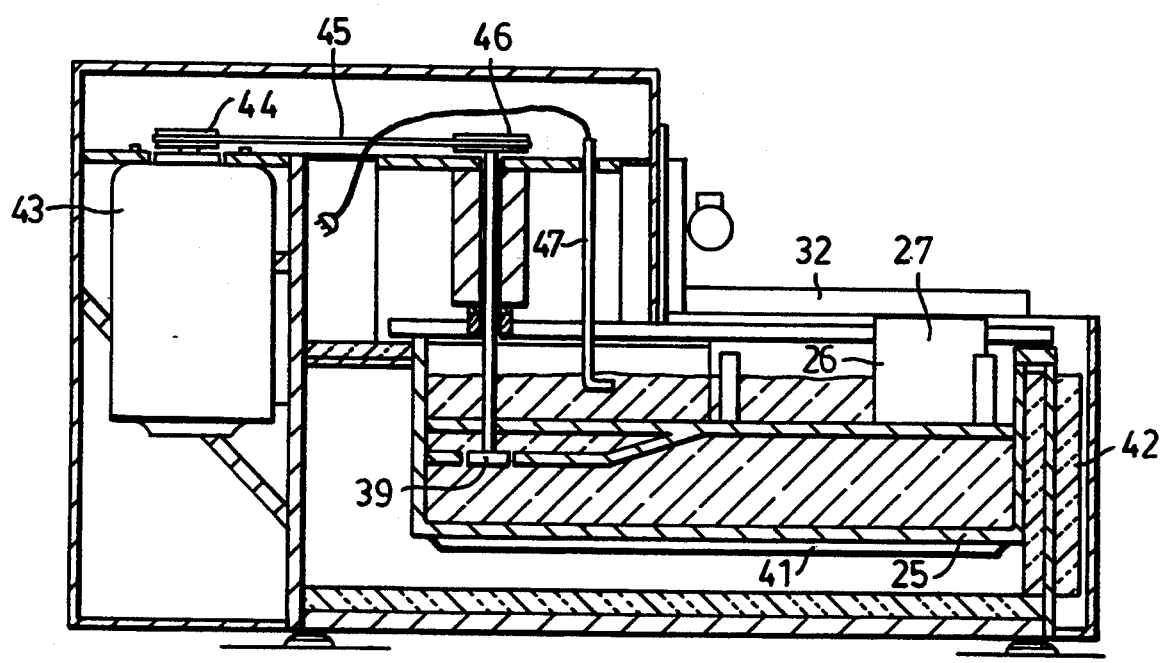
FIG. 5 is a sectional view of a complete soldering apparatus in accordance with my invention.

FIG. 5 is a simplified crossection of the complete apparatus. The solder pot 25 is equipped with heaters 41 energized from a suitable source of electrical energy and with a an insulating jacket 42. The pump 35 is driven by a motor 43 through pulleys 44 and 46 and belt 45 and the temperature of the solder is sensed by thermocouple 47.

Figure 7:
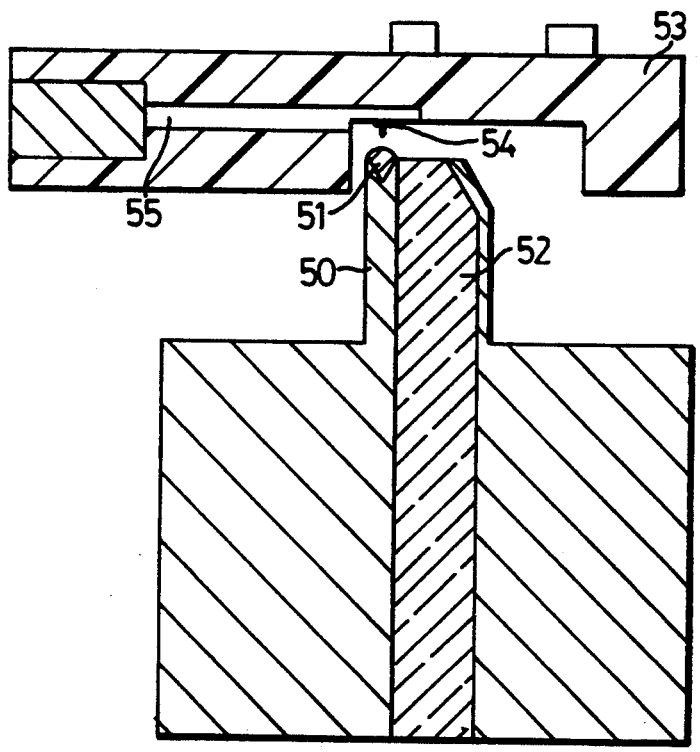
FIG. 7 is an elevational view, partly in section, of the invention as applied to a single lead point.

FIG. 7 illustrates the application of the invention to a single lead point, for example a potentiometer including both plastic and metal parts which requires connection to a lead. A pin 50 has a small aperture 51 at its top which may be a simple conical depression. Adjacent the pin is a duct 52 which leads down to a solder bath in the same manner as duct 27 in FIG. 2. The solder, when put under pressure by the pump, flows up duct 52 floods aperture 51 and, when the pump is stopped, leaves a controlled quantity of solder in the aperture with an upper surface determined by the form of the meniscus of the solder.

OPERATION

The solder bath is brought up to temperature through suitable heating means, as sensed by thermocouple 47. Motor 43 is activated causing pump 39 to increase the pressure in the liquid solder below wall 29. This causes a flow of solder up the ducts 27 and 28 flooding cups 23 and 24. The motor is now deactivated and the bracket 32 lowered immersing the terminals 15–18 and conductors 19–22 in the meniscus of solder in the cups 23 and 24. The bracket 32 is now raised and the board 10 moved on to the next station on the assembly line. The next board may now be processed in the same manner.

Figure 6:
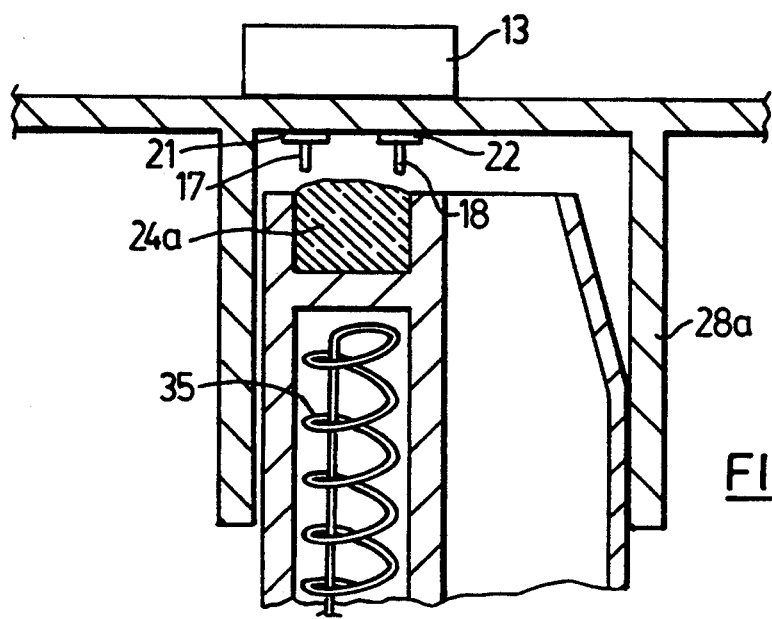
FIG. 6 is an example of a modified component of the apparatus of FIG. 2 useful in particular situations.

Situation may arise where the terminals to be soldered are contained within a deep walled enclosure. In these situations it may be necessary to design a special fixture, such a that shown in FIG. 6, to reach up inside the enclosure to apply the solder to the terminals and conductors. Elongated cups such as 24a may also tend to be cooler than the solder bath 25 and it may be necessary to add special heating elements such as element 35.

In a similar manner the single lead point of a component may be soldered to a lead as illustrated in FIG. 7. The solder is caused to flow up duct 52 flooding aperture 51 and then the pump is stopped leaving a small quantity of solder on the top end of the pin 50. The pin and the component 53 are now moved towards each other until the component terminal 54 and the metallic lead 55 are immersed in solder.

As previously indicated, while the process has been described in association with the soldering step, it is similarly applicable to fluxing of the components before soldering. The solder pot would be replaced by a flux bath and the operation would proceed as previously described. The flux required would, of course depend on various factors such as the nature of the metals involved and the ambient atmosphere. As known to those skilled in the art inert atmosphere processes, such as that described in U.S. Pat. No. 4,821,947, may reduce or eliminate the need for flux.

The process may, of course, be timed and controlled by suitable electronic means including thermal sensors, timing apparatus, location sensors, pump control, liquid level sensors etcetera, in a manner well known to those skilled in the art.

While the movement of the board and cups relative to each other has been described as motion of the board it will be understood that the cups or fixture 26 could move instead, if such an arrangement was advantageous. Flexibility of application of the apparatus could also be increased by feeding the ducts 27 and 28 through flexible tubes rather than alignment with apertures 30 and 31. For example a flexible metal tube can be fitted to communicate with the solder below wall 29 and connected to duct 27. The fixture 26 may then be relocated as desired to accommodate various situations. Such an arrangement would also permit motion of the fixture 26 instead of the board 10, as suggested above.

While the process has been described as a soldering process it will be understood that it may have application to various metal joining processes where one of the metals is a pumpable liquid.

I claim:

1. A soldering process for joining a pair of metallic members comprising providing a flow of liquid solder to a container, terminating said flow of solder when said container is overflowing leaving the container full of solder with a meniscus determined by the viscosity of the solder, moving said metallic members and the container with respect to each other until the metallic members are immersed in the solder, removing said metallic members from the solder and permitting the metallic members to cool.

2. An apparatus for spot soldering metallic leads comprising:
   a container;
   a duct for supplying solder to said container, emptying into said container;
   a pot containing liquid solder connected to said duct:
   a pump applying pressure to said solder in said pot sufficient to cause said solder to flow into said container and to fill said container to overflowing;
   means to terminate the operation of said pump and the application of pressure to said solder after said container is filled to overflowing;
   means to cause said metallic leads to be immersed in the solder in said container to a depth determined by the surface of said solder when said container is filled to overflowing; and
   means to remove said metallic leads from said container.

3. A process as claimed in claim 1 including the step of maintaining the solder at a specified temperature.

4. A process as claimed in claim 1 including the step of continuing the flow of solder for a determined time sufficient to ensure the said container is filled to overflowing.

5. An apparatus as claimed in claim 2 wherein said container is only slightly larger than the junction of said metallic leads.

6. An apparatus as claimed in claim 2 wherein said duct is flexible.

7. An apparatus for spot soldering junctions of metallic leads comprising:

a solder pot containing solder in a liquid condition;

a wall in said pot parallel to and not above the level of said solder;

a container within said solder pot and above said wall, said container having dimensions adequate to accept one of said junctions;

a duct have one end connected through said wall and immersed in said solder and its other end level with and adjacent the upper edge of said container;

means to apply pressure to the solder below the said wall sufficient to cause the solder to flow up said duct and into said container;

means to cause termination of the application of pressure after said container is full to over-flowing with solder;

means to cause said junction to be immersed in the solder held in said container;

means to cause said junction to be removed from said solder in said container.

8. Apparatus as claimed in claim 7 wherein said duct is a flexible metal tube.

9. Apparatus as claimed in claim 7 wherein said solder pot includes a thermostat for measuring and controlling the temperature of said pot.

10. Apparatus as claimed in claim 7 wherein said means to apply pressure is a motor driven pump immersed in said solder.

11. Apparatus as claimed in claim 7 wherein said means to cause said junction to be immersed in the solder comprises a conveyer line carrying components including said junctions with the junctions projecting downwards from said components, said conveyer line moving said components downwards when they are positioned over said container until said junctions are inmmersed in the solder held in the container.

12. An apparatus as claimed in claim 11 wherein the downward motion of the conveyer line is related to the level of the meniscus of the solder in said container.

* * * * *